United States Patent
Kling et al.

(10) Patent No.: US 6,573,010 B2
(45) Date of Patent: Jun. 3, 2003

(54) METHOD AND APPARATUS FOR REDUCING INCIDENTAL EXPOSURE BY USING A PHASE SHIFTER WITH A VARIABLE REGULATOR

(75) Inventors: Michael E. Kling, Austin, TX (US); Hua-Yu Liu, Palo Alto, CA (US)

(73) Assignee: Numerical Technologies, Inc., San Jose, CA (US)

( * ) Notice: Subject to any disclaimer, the term of this patent is extended or adjusted under 35 U.S.C. 154(b) by 203 days.

(21) Appl. No.: 09/843,487

(22) Filed: Apr. 25, 2001

(65) Prior Publication Data

US 2002/0142231 A1 Oct. 3, 2002

Related U.S. Application Data

(60) Provisional application No. 60/281,325, filed on Apr. 3, 2001.

(51) Int. Cl.[7] .............................. G03F 9/00; G06F 17/50
(52) U.S. Cl. ............................................. 430/5; 716/19
(58) Field of Search ........................... 430/5, 311, 322, 430/323, 324, 394; 716/19, 21

(56) References Cited

U.S. PATENT DOCUMENTS

| | | | |
|---|---|---|---|
| 4,037,918 A | 7/1977 | Kato | 350/3.5 |
| 5,324,600 A | 6/1994 | Jinbo et al. | 430/5 |
| 5,334,542 A | 8/1994 | Saito et al. | 437/40 |

(List continued on next page.)

FOREIGN PATENT DOCUMENTS

| | | |
|---|---|---|
| DE | 195 45 163 A1 | 6/1996 |
| EP | 0 464 492 A1 | 1/1992 |
| EP | 0 653 679 A2 | 5/1995 |
| GB | 2333613 A | 7/1999 |
| JP | 62067547 | 3/1987 |
| JP | 2-140743 | 5/1990 |
| JP | 6-67403 | 3/1994 |
| JP | 8-51068 | 2/1996 |
| WO | WO 98/12605 A1 | 3/1998 |
| WO | WO 01/23961 A1 | 4/2001 |
| WO | WO 02/03140 A1 | 1/2002 |
| WO | WO 02/073312 A1 | 9/2002 |

OTHER PUBLICATIONS

Wang, R., et al., "Plarized Phase Shift Mask: Concept, Design, and Potential Advantages to Photolithography Process and Physical Design", Motorola Semiconductor Product Sensor (12 pages).

Ogawa, K., et al., "Phase Defect Inspection by Differential Interference", Lasertee Corporation (12 pages).

Pistor, T., "Rigorous 3D Simulation of Phase Defects in Alternating Phase–Shifting Masks", Panoramic Technology Inc. (13 pages).

Semmier, A., et al., "Application of 3D EMF Simulation for Development and Optimization of Alternating Phase Shifting Masks", Infineon Technologies AG (12 pages).

(List continued on next page.)

Primary Examiner—S. Rosasco
(74) Attorney, Agent, or Firm—Park, Vaughan & Fleming LLP

(57) ABSTRACT

One embodiment of the invention provides a system for reducing incidental exposure caused by phase shifting during fabrication of a semiconductor chip. The system operates by identifying a problem area of likely incidental exposure in close proximity to an existing phase shifter on a phase shifting mask, wherein the problem area includes a polysilicon line passing through a field region of the semiconductor chip. The system places an additional phase shifter into the problem area on the phase shifting mask so that a regulator within the additional phase shifter protects the polysilicon line passing through the field region. This additional phase shifter has a wider regulator than the existing phase shifter, wherein the existing phase shifter is used to expose a polysilicon line in a gate region of the semiconductor chip.

23 Claims, 8 Drawing Sheets

U.S. PATENT DOCUMENTS

| | | | |
|---|---|---|---|
| 5,472,814 A | 12/1995 | Lin | 430/5 |
| 5,480,746 A | 1/1996 | Jinbo et al. | 430/5 |
| 5,496,666 A | 3/1996 | Chu et al. | 430/5 |
| 5,527,645 A | 6/1996 | Pati et al. | 430/5 |
| 5,537,648 A | 7/1996 | Liebmann et al. | 395/500 |
| 5,539,568 A | 7/1996 | Lin et al. | 359/285 |
| 5,636,131 A | 6/1997 | Liebmann et al. | 364/490 |
| 5,858,580 A | 1/1999 | Wang et al. | 430/5 |
| 5,923,562 A | 7/1999 | Liebmann et al. | 364/488 |
| 5,998,068 A | 12/1999 | Matsuoka | 430/5 |
| 6,057,063 A | 5/2000 | Liebmann et al. | 430/5 |
| 6,066,180 A | 5/2000 | Kim et al. | 716/19 |
| 6,077,630 A | 6/2000 | Pierrat | 430/5 |
| 6,130,012 A | 10/2000 | May et al. | 430/5 |
| 6,139,994 A | 10/2000 | Broeke et al. | 430/5 |
| 6,185,727 B1 | 2/2001 | Liebmann | 716/19 |
| 6,228,539 B1 | 5/2001 | Wang et al. | 430/5 |
| 6,251,549 B1 | 6/2001 | Levenson | 430/11 |
| 6,258,493 B1 | 7/2001 | Wang et al. | 430/5 |
| 6,335,128 B1 | 1/2002 | Cobb et al. | 430/5 |
| 6,338,922 B1 | 1/2002 | Liebmann et al. | 430/5 |
| 6,420,074 B2 | 7/2002 | Wang et al. | 430/5 |
| 6,436,590 B2 | 8/2002 | Wang et al. | 430/5 |
| 2001/0000240 A1 | 4/2001 | Wang et al. | 430/5 |
| 2001/0028985 A1 | 10/2001 | Wang et al. | 430/5 |
| 2002/0083410 A1 | 6/2002 | Wu et al. | 716/19 |
| 2002/0127479 A1 | 9/2002 | Pierrat | 430/5 |
| 2002/0129327 A1 | 9/2002 | Pierrat et al. | 716/19 |
| 2002/0136964 A1 | 9/2002 | Pierrat | 430/5 |
| 2002/0142231 A1 | 10/2002 | Kling et al. | 430/5 |
| 2002/0142232 A1 | 10/2002 | Kling et al. | 430/5 |
| 2002/0144232 A1 | 10/2002 | Ma et al. | 716/21 |
| 2002/0152454 A1 | 10/2002 | Cote et al. | 716/21 |
| 2002/0155363 A1 | 10/2002 | Cote et al. | 430/5 |

OTHER PUBLICATIONS

Wong, A., et al., "Polarization Effects in Mask Transmission", University of California Berkeley (8 pages).

Hirai, Y., et al., "Automatic Pattern Generation System for Phase Shfiting Mask", 1991 Symposium on VLSI Technology, Digest of Technical Papers, pp. 95–96, May 28–30, 1991.

Wong, A., et al., "Investigating Phase–Shifting Mask Layout Issues Using a Cad Toolkit", IEEE, pp. 27.4.1–27.4.4 (1991).

Terasawa, T., et al., "Imaging Characteristics of Multi–Phase–Shifting and Halftone Phase–Shifting Masks", Japanese Journal of Applied Physics, vol. 30, No. 11B, pp. 2991–2997, Nov. 1991.

Inoue, S., et al., "Simulation Study on Phase–Shifting Masks for Isolated Patterns", Japanese Journal of Applied Physics, vol. 30, No. 11B, pp. 3010–3015, Nov. 1991.

Watanabe, H., et al., "Detection and Printability of Shifter Defects in Phase–Shifting Masks", Japanese Journal of Applied Physics, vol. 30, No. 11B, pp. 3016–3020, Nov. 1991.

Watanabe, H., et al., "Pattern Transfer Characteristics of Transparent Phase Shifting Mask", Japanese Journal of Applied Physics, vol. 30, No. 11B, pp. 3004–3009, Nov. 1991.

Moniwa, A., et al., "Algorithm for Phase–Shift Mask Design with Priority on Shifter Placement", Jpn. J. Appl. Phys., vol. 32, Pt. 1, No. 12B, pp. 5874–5879, Dec. 1193.

Ooi, K., et al., "Computer Aided Design Software for Designing Phase–Shifting Masks", Jpn. J. Appl. Phys., vol. 32, Pt. 1, No. 12B, pp. 5887–5891, Dec. 1993.

Ohtsuka, H., et al., "Evaluation of Repair Phase and Size Tolerance for a Phase–Shift Mask", J. Vac. Sci. Technol. B, vol. 11, No. 6, pp. 2665–2668, Nov./Dec. 1993.

Moniwa, A., et al., "Heuristic Method for Phase–Conflict Minimization in Automatic Phase–Shift Mask Design", Jpn. J. Appl. Phys., vol. 34, Pt. 1, No. 12B, pp. 6584–6589, Dec. 1995.

Ohnuma, H., et al., "Lithography Computer Aided Design Technology for Embedded Memory in Logic", Jpn. J. Appl. Phys., vol. 37, Part I, No. 12B, pp. 6686–6688, Dec. 1998.

Kikuchi, K., et al., "Method of Expanding Process Window for the Double Exposure Technique with alt–PSMs", Optical Microlithography XIII, Proceeding of SPIE, vol. 4000, pp. 121–131 (2000).

Schmidt, R., et al., "Impact of Coma on CD Control for Multiphase PSM Designs", AMD, ASML (11 pages).

Erdmann, A., "Topography Effects and Wave Aberrations in Advanced PSM–Technology", Fraunhofer Institute of Integrated Circuits (11 pages).

Granik, Y., et al., "CD Variation Analysis Technique and its Application to the Study of PSM Mask Misalignment", Mentor Graphics (9 pages).

Hanyu, et al., "New Phase–Shifting Mask with Highly Transparent SiO2 Phase Shifters", Fujitsu Laboratories Ltd. (11 pages).

Ishiwata, N., et al., "Fabrication of Phase–Shifting Mask", Fujitsu Limited (11 pages).

Levenson, M., et al., "Phase Phirst! An Improved Strong–PSM Paradigm", M.D. Levenson Consulting, Petersen Advanced Lithography, KLA–Tencor (10 pages).

Levenson, M., et al., "SCAA Mask Exposures and Phase Phirst Design for 110nm and Below", M.D. Levenson Consulting, Canon USA, Inc., JSR Microelectronics, Inc. (10 pages).

Lin, B.J., "The Relative Importance of the Building Blocks for 193nm Optical Lithography", Linnovation, Inc., (12 pages).

McCallum, M., et al., "Alternating PSM Mask Performance—a Study of Multiple Fabrication Technique Results", International SEMATECH (6 pages).

Morikawa, Y., et al., "100nm–alt.PSM Structure Discussion for ArF Lithography", Dai–Nippon Printing Co., Ltd. (15 pages).

Ozaki, T., et al., "A 0.15um KrF Lithography for 1Gb DRAM Product Using Highly Printable Patterns and Thin Resist Process", Toshiba Corporation (2 pages).

Rhyins, P., et al., "Characterization of Quartz Etched PSM Masks for KrF Lithography at the 100nm Node", Photronics, Inc., MIT Lincoln Lab, ARCH Chemicals, Finle Technologies, KLA Tencor Corp. (10 pages).

Ronse, K., et al., "Thin Film Interference Effects in Phase Shifting Masks Causing Phase and Transmittance Errors", IMEC (15 pages).

Rosenbluth, A., et al., "Optimum Mask and Source Patterns to Print a Given Shape", IBM (17 pages).

Sakata, M., et al., "A Novel Radiation Sensitive Spin–on–Glass Convertible into SiO2 and the Simple Fabrication Process Using It", Oki Electric Industry Co. Ltd. (3 pages).

Schmidt, R., et al., "Impact of Coma on CD Control for Multiphase PSM Designs", AMD, ASML (10 pages).

Sewell, H., et al., "An Evaluation of the Dual Exposure Technique", SVG Lithography Systems Inc. (11 pages).

Spence, C., et al., "Optimization of Phase–Shift Mask Designs Including Defocus Effects", AMD, Princeton University, Vecor Technologies Inc. (8 pages).

Suzuki, A., et al., "Multilevel Imaging System Realizing k1–30 –.3 Lithogrpahy", Canon Inc. (13 pages).

Vandenberghe, G., et al., "(Sub–) 100nm Gate Patterning Using 248nm Alternating PSM", IMEC, Mentor Graphics (9 pages).

Fritze, M., et al., "100–nm Node Lithography with KrF?", MIT Lincoln Lab, Numberical Technologies, Photronics, Arch Chemicals (14 pages).

Fukuda, H., et al., "Patterning of Random Interconnect Using Double Exposure of Strong–Type PSMs", Hitachi Central Research Lab (8 pages).

Ferguson, R., et al., "Pattern–Dependent Correction of Mask Topography Effects for Alternating Phase–Shifting Masks", IBM Microelectronics, University of California Berkeley (12 pages).

Toublan, O., et al., "Phase and Transmission Errors Aware OPC Solution for PSM: Feasibility Demonstration", Mentor Graphics Corp. (7 pages).

Yanagishita, Y., et al., "Phase–Shifting Photolithography Applicable to Real IC Patterns", Fujitsu Limited (11 pages).

Levenson, M., et al., "The Phase–Shifting Mask II: Imaging Simulations and Submicrometer Resist Exposures", IEEE Transactions on Electron Devices, vol. ED–31, No. 6, pp. 753–763, Jun. 1984.

IBM, "Method to Produce Sizes in Openings in Photo Images Smaller Than Lithographic Minimum Size", IBM Technical Disclosure Bulletin, vol. 29, No. 3, p. 1328, Aug. 1986.

Buraschi, M., et al., "Optical–Diffraction–Based Modulation of Photoresist Profile or Microlithography Applications", Optical Engineering, vol. 28, No. 6, pp. 654–658, Jun. 1989.

Nitayama, A., et al., "New Phase Shifting Mask with Self–Aligned Phase Sifters for a Quarter Micron Photolithography", IEDM, pp. 3.3.1–3.3.4, Dec. 3–6, 1989.

Toh, K., et al., "Chromeless Phase–Shifted Masks: A New Approach to Phase–Shifting Masks", BACUS—Tenth Annual Symposium on Microlithography, Sep. 1990 (27 pages).

Yamanaka, T., et al., "A 5.9um2 Super Low Power SRAM Cell Using a New Phase–Shift Lithography", IEDM, pp. 18.3.1–18.3.4 (1990).

Nakagawa, K., et al., "Fabrication of 64m DRAM with I–Line Phase–Shift Lithography", IEDM, pp. 33.1.1–33.1.4 (1990).

Watanabe, H., et al., "Transparent Phase Shifting Mask", IEDM, pp. 33.2.1–33.2.4 (1990).

Burggraaf, P., "Four More Significant Japanese Advances in Phase Shifting Phase Shfiting Technology", Semiconductor International, p. 16, Dec. 1991.

Kemp, K., et al., "Optimized Phase Shift Mask Designs for Real Devices", KTI Microlithography Seminar, pp. 67–75, Oct. 14–15, 1991.

Newmark, D., et al., "Phase–Shifting Mask Design Tool", SPIE—11th Annual BACUS Symposium on Photmask Technology, vol. 1604, pp. 226–235, Sep. 25–27, 1991.

Nolscher, C., et al., "Investigation of Self–Aligned Phase–Shifting Reticles by Simulation Techniques", SPIE—Optical/Laser Microlithography IV, vol. 1463, pp. 135–150 (1991).

Burggraaf, P., "Lithography's Leading Edge, Part 1: Phase–Shift Technology and Part 2: I–Line and Beyond", Semiconductor International, pp. 43–47, and 52–56, Feb. 1992.

Hosono, K., et al., "A Novel Architecture for High Speed Dual Image Generation of Pattern Data for Phase Shifting Reticle Inspection", SPIE—Integrated Circuit Metrology, Inspection, and Process Control VI, vol. 1673, pp. 229–235 (1992).

IBM, "Phase–Shift Mask Utilizing Silicon Oxy–Nitride as a Low Reflectivity Phase–Shift Layer", IBM Technical Disclosure Bulletin, vol. 34, No. 10B, pp. 360–361, Mar. 1992.

Ronse, K., et al., "Comparison of Various Phase Shift Strategies and Application to 0.35um ASIC Designs", SPIE—Optical/Laser Microlithography VI, vol. 1927, pp. 2–16 (1993).

Troccolo, P., et al., "Interferometric Measurement of Etch Depths in Phase Shift Masks", BACUS News, vol. 9, Issue 6, pp. 1 & 4–6, Jun. 1993.

Watanabe, H., et al., "Phase–Shifting Lithography: Mask-making and its Application", J. Vac. Sci. Technol. B, vol. 11, No. 6, pp. 2669–2674, Nov./Dec. 1993.

Waas, T., et al., "Automatic Generation of Phase Shift Mask Layouts", Microelectronic Engineering, vol. 23, pp. 139–142 (1994).

Langston, J., et al., "Extending Optical Lithography to 0.25um and Below", Solid State Technology, pp. 57–64, Mar. 1995.

Nagahiro, Y., "Improved Mask Technique for Photolithography Applied to 0.25um LSI—Improvement of Resolution, Pattern Correction, Exposure Area", Nikkei Microdevices, pp. 1–6, Apr. 1995.

Okamoto, Y., et al., "A New Phase Shifting Mask Technology for Quarter Micron Photolithography", SPIE, vol. 2512, pp. 311–318 (1995).

Pierrat, C., et al., "Required Optical Characteristics of Materials for Phase–Shifting Masks", Applied Optics, vol. 34, No. 22, pp. 4923–4928, Aug. 1, 1995.

Galan, G., et al., "Alternating Phase Shift Generation for Coplex Circuit Designs", SPIE, vol. 2884, pp. 508–519, Sep. 18–20, 1996.

Kanai, H., et al., "Sub–Quarter Micron Lithography with the Dual–Trench Type Alternating PSM", SPIE, vol. 2793, pp. 165–173 (1996).

Ishida, S., et al., "Large Assist Feature Phase–Shift Mask for Sub–Quarter Micrometer Window Pattern Formation", SPIE, vol. 3096, pp. 333–343 (1997).

Nakae, A., et al., "A Proprosal for Pattern Layout Rule in Application of Alternating Phase Shift Mask", SPIE, vol. 3096, pp. 362–374 (1997).

Tsujimoto, E., et al., "Hierarchical Mask Data Design System (PROPHET) for Aerial Image Simulation, Automatic Phase–Shifter Placement, and Subpeak Overlap Checking", SPIE, vol. 3096, pp. 163–172 (1997).

Yamamoto, K., et al., "Hierarchical Processing of Levenson–Type Phase Shifter Generation", Jpn. J. Appl. Phys., vol. 36, Part 1, No. 12B, pp. 7499–7503, Dec. 1997.

Gordon, R., et al., "Design and Analysis of Manufacturable Alternating Phase–Shifting Masks", Bacus News, vol. 14, Issue 12, pp. 1–9, Dec. 1998.

Nara, M., et al., "Phase Controllability Improvement for Alternating Phase Shift Mask", Dai Nippon Printing Co., Ltd. (16 pages).

Petersen, J., et al., "Designing Dual–Trench Alternating Phase–Shift Masks for 140nm and Smaller Features Using 248–nm KrF and 193–nm ArF Lithography", Bacus News, vol. 14, Issue 8, pp. 1 & 4–13, Aug. 1998.

Kuo, C., et al., "Extension of Deep–Ultraviolet Lithography for Patterning Logic Gates Using Alternating Phase Shifting Masks", J. Vac. Sci. Technol. B, vol. 17, No. 6, pp. 3296–3300, Nov./Dec. 1999.

Palmer, S., et al., "Dual Mask Model–Based Proximity Correction for High Performance 0.10um CMOS Process", The 44th International Conference on Electron, Ion and Photon Beam Technology and Nanofabrication Abstracts, pp. 18–19, May 30–Jun.

Pierrat, C., "Investigation of Proximity Effects in Alternating Aperture Phase Shifting Masks", Numerical Technologies, Inc. (11 pages).

Cote, M., et al., "A Practical Application of Full–Feature Alternating Phase–Shifting Technology for a Phase–Aware Standard–Cell Design Flow", Numerical Technologies Inc. (6 pages).

Heng, F., et al., "Application of Automated Design Migration to Alternating Phase Sifht Mask Design", IBM Research Report RC 21978 (98769), Feb. 26, 2001 (7 pages).

Wong, A., et al., "Alternating Phase–Shifting Mask with Reduced Aberration Sensitivity: Lithography Considerations", Proc. SPIE, vol. 4346, pp. 1–9 (2001).

Cooke, M., "OPC/PSM Designs For Poly Gate Layers", European Semiconductor, vol. 22, No. 7, pp. 57–59, Jul. 2000.

Granik, Y., et al., "Sub–Resolution Process Windows And Yield Estimation Technique Based On Detailed Full–Chip CD Simulation", SPIE, vol. 4182, pp. 335–341 (2000).

Plat, M., et al., "The Impact of Optical Enhancement Techniques on the Mask Error Enhancement Funchtion (MEEF)", SPIE, vol. 4000, pp. 206–214, Mar. 1–3, 2000.

Mansuripur, M., et al., "Projection Photolithography", Optics & Photonics News 11, 17 pages, Feb. 2000.

METHOD AND APPARATUS FOR REDUCING INCIDENTAL EXPOSURE BY USING A PHASE SHIFTER WITH A VARIABLE REGULATOR

RELATED APPLICATION

This application hereby claims priority under 35 U.S.C. 119 to U.S. Provisional Patent Application No. 60/281,325 filed Apr. 3, 2001, entitled "Using Double Exposure Effects During Phase Shifting to Control Line End Shortening," by the same inventors as the instant application.

The subject matter of this application is also related to the subject matter in a co-pending non-provisional application by the same inventors as the instant application and filed on the same day as the instant application entitled, "Method and Apparatus for Reducing Incidental Exposure by Using a Phase Shifter with a Variable Regulator," having Ser. No. TO BE ASSIGNED, and filing date TO BE ASSIGNED.

FIELD OF THE INVENTION

The invention relates to the process of fabricating semiconductor chips. More specifically, the invention relates to a method and an apparatus reducing incidental exposure caused by phase shifting during fabrication of a semiconductor chip.

BACKGROUND

Related Art

Recent advances in integrated circuit technology have largely been accomplished by decreasing the feature size of circuit elements on a semiconductor chip. As the feature size of these circuit elements continues to decrease, circuit designers are forced to deal with problems that arise as a consequence of the optical lithography process that is typically used to manufacture integrated circuits. This optical lithography process generally begins with the formation of a photoresist layer on the surface of a semiconductor wafer. A mask composed of opaque regions, which are generally formed of chrome, and transmissive clear regions (chromeless), which are generally formed of quartz, is then positioned over this photo resist coated wafer. (Note that the term "mask" as used in this specification is meant to include the term "reticle.") Exposure energy is then shone on the mask from an exposure energy source, such as a visible light source or an ultraviolet light source.

This exposure energy is generally reduced and focused through an optical system that contains a number of lenses, filters and mirrors. The exposure energy passes through the clear regions of the mask and exposes the underlying photoresist layer. At the same time, the exposure energy is blocked by opaque regions of mask, leaving underlying portions of the photoresist layer unexposed.

The exposed photoresist layer is then developed, typically through chemical removal of the exposed/non-exposed regions of the photoresist layer. The end result is a semiconductor wafer with a photoresist layer having a desired pattern. This pattern can then be used for etching underlying regions of the wafer.

One problem that arises during the optical lithography process is "line end shortening" and "pullback" caused by optical effects. For example, the upper portion of FIG. 1 illustrates a design of a transistor with a polysilicon line 102, running from left to right, that forms a gate region used to electrically couple an upper diffusion region with a lower diffusion region. The lower portion of FIG. 1 illustrates the actual printed image that results from the design. Note that polysilicon line 102 has been narrowed using optical phase shifting in order to improve the performance of the transistor by reducing the resistance through the gate region.

Also note that because of optical effects and resist pullback there is a significant amount of line end shortening.

In order to compensate for line end shortening, designers often add additional features, such as "hammer heads," onto line ends. As is illustrated in FIG. 2, these additional features can effectively compensate for the problem of line end shortening in some situations. However, if these additional features cause line ends to get too close together, a bridge can potentially be created as is illustrated in the middle portion of FIG. 2.

This bridging problem can be alleviated by introducing a separation between the hammer heads. However, introducing such a separation increases the size of the circuit element, which means that fewer circuit elements can be integrated into the semiconductor chip. Additionally, if hammerheads are added after layout, a design rule violation may occur.

What is needed is a method and an apparatus for mitigating the line end shortening problem without introducing additional separation between line ends.

Another problem in optical lithography arises from incidental exposure caused by phase shifters. Phase shifters are often incorporated into a mask in order to achieve line widths that are smaller than the wavelength of the exposure energy that is used to expose the photoresist layer through the mask. During phase shifting, the destructive interference caused by two adjacent clear areas on a mask is used to create an unexposed area on the photoresist layer. This is accomplished by exploiting the fact that exposure energy passing through a mask's clear regions exhibits a wave characteristic having a phase that is a function of the distance the exposure energy travels through the mask material. By placing two clear areas adjacent to each other on the mask, one of thickness $t_1$, and the other of thickness $t_2$, one can obtain a desired unexposed area on the underlying photoresist layer caused by interference. By varying the thickness $t_1$ and $t_2$ appropriately, the exposure energy exiting the material of thickness $t_2$ is 180 degrees out of phase with the exposure energy exiting the material of thickness $t_1$. Phase shifting is described in more detail in U.S. Pat. No. 5,858,580, entitled "Phase Shifting Circuit Manufacture Method and Apparatus," by inventors Yao-Ting Wang and Yagyensh C. Pati, filed Sep. 17, 1997 and issued Jan. 12, 1999, which is hereby incorporated by reference.

One problem with phase shifters is that they often cause incidental exposure in neighboring regions of the photoresist layer. For example, FIG. 6 illustrates how two phase shifters are used to reduce the thickness of a polysilicon line 606 in the gate regions of two transistors.

A first phase shifter is composed of a zero-degree phase clear area 604 that works in concert with a 180-degree phase clear area 608 to reduce the width of polysilicon line 606 in the gate region of a first transistor. This first transistor selectively creates a conducting path between diffusion region 602 and diffusion region 610.

Note that a thin chromium regulator 605 is typically added to the mask between zero-degree phase clear area 604 and 180-degree phase clear area 608 in order to shield a portion of the underling photoresist layer.

Similarly, a second phase shifter is composed of a zero-degree phase clear area 614 that works in concert with a 180-degree phase clear area 618 to reduce the width of polysilicon line 606 in the gate region of a second transistor. This second transistor selectively creates a conducting path between diffusion region 612 and diffusion region 620. Within the second phase shifter, chromium regulator 615 separates zero-degree phase clear area 604 and 180-degree phase clear area 608.

The first and second phase shifters are typically incorporated into a separate phase shifting mask, which is used to reduce the width of polysilicon line 606 in the gate regions of the first transistor and the second transistor, respectively.

Unfortunately, using these phase shifters often causes incidental exposure of polysilicon line 606 in the field regions of integrated circuit, such as section 616 of polysilicon line 606. This incidental exposure can degrade performance of section 616, or can cause a broken line in section 616.

One solution to this problem is to extend the first and second phase shifters into the field region, as is illustrated in FIG. 7. In this way the first and second phase shifters are effectively combined into a single long phase shifter.

This solution protects polysilicon line 606 from incidental exposure. However, it also reduces the width of polysilicon line 606 in the field region between the first and second transistors. This increases the resistance of polysilicon line 606 in the field region, and can thereby degrade performance.

What is needed is a method and an apparatus for reducing incidental exposure caused by phase shifting without the resistance problems caused by extending phase shifters over polysilicon lines in field regions.

SUMMARY

One embodiment of the invention provides a system for reducing incidental exposure caused by phase shifting during fabrication of a semiconductor chip. The system operates by identifying a problem area of likely incidental exposure in close proximity to an existing phase shifter on a phase shifting mask, wherein the problem area includes a polysilicon line passing through a field region of the semiconductor chip. The system places an additional phase shifter into the problem area on the phase shifting mask so that a regulator within the additional phase shifter protects the polysilicon line passing through the field region. This additional phase shifter has a wider regulator than the existing phase shifter, wherein the existing phase shifter is used to expose a polysilicon line in a gate region of the semiconductor chip.

In one embodiment of the invention, the additional phase shifter is located so that it becomes an extension of the existing phase shifter, wherein the extension has a wider regulator than the existing phase shifter.

In one embodiment of the invention, the existing phase shifter extends past the gate region into an extension region prior to reaching the additional phase shifter located in the field region. In a variation on this embodiment, the polysilicon line is protected by the regulator within the extended phase shifter, wherein the regulator has a first width in the gate region, a second width in the extension region and a third width in the field region.

In one embodiment of the invention, the additional phase shifter couples together a first existing phase shifter, that covers a gate region of a first transistor, with a second existing phase shifter, that covers a gate region of a second transistor, to form a combined phase shifter. This combined phase shifter covers the gate region of the first transistor, the gate region of the second transistor, and a field region between the first transistor and the second transistor, and has a regulator that is wider in the field region than in either of the gate regions.

In one embodiment of the invention, the system uses the phase shifting mask and a non-phase shifting binary mask in a double exposure process to fabricate a layer on the semiconductor chip. In a variation on this embodiment, the phase shifting mask and the non-phase shifting binary mask comprise a first mask and a second mask. The first mask has opaque regions and transmissive regions that are organized into a first pattern that defines an unexposed line on a photoresist layer on a surface of a semiconductor wafer when positioned under the first mask. The second mask has opaque regions and transmissive regions that are organized into a second pattern that defines an exposure region on the photoresist layer when positioned under the second mask. This exposure region cuts through the unexposed line defined by the first mask on the photoresist layer to create the line end in the unexposed line, without the optical line end shortening that arises from creating the line end with a single mask.

In one embodiment of the invention, the additional phase shifter includes a zero-degree phase clear area on one side of the polysilicon line, a regulator covering the polysilicon line, and a 180-degree phase clear area on the other side of the polysilicon line. An energy source shining through the phase shifting mask produces a region of destructive interference on a photoresist layer that is used to produce the polysilicon line.

In one embodiment of the invention, the regulator is formed using chromium.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the invention. Thus, the invention is not intended to be limited to the embodiments shown, but is to be accorded the widest scope consistent with the principles and features disclosed herein.

The data structures and code described in this detailed description are typically stored on a computer readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet.

Using Double Exposure to Control Line End Shortening

Figure 1:
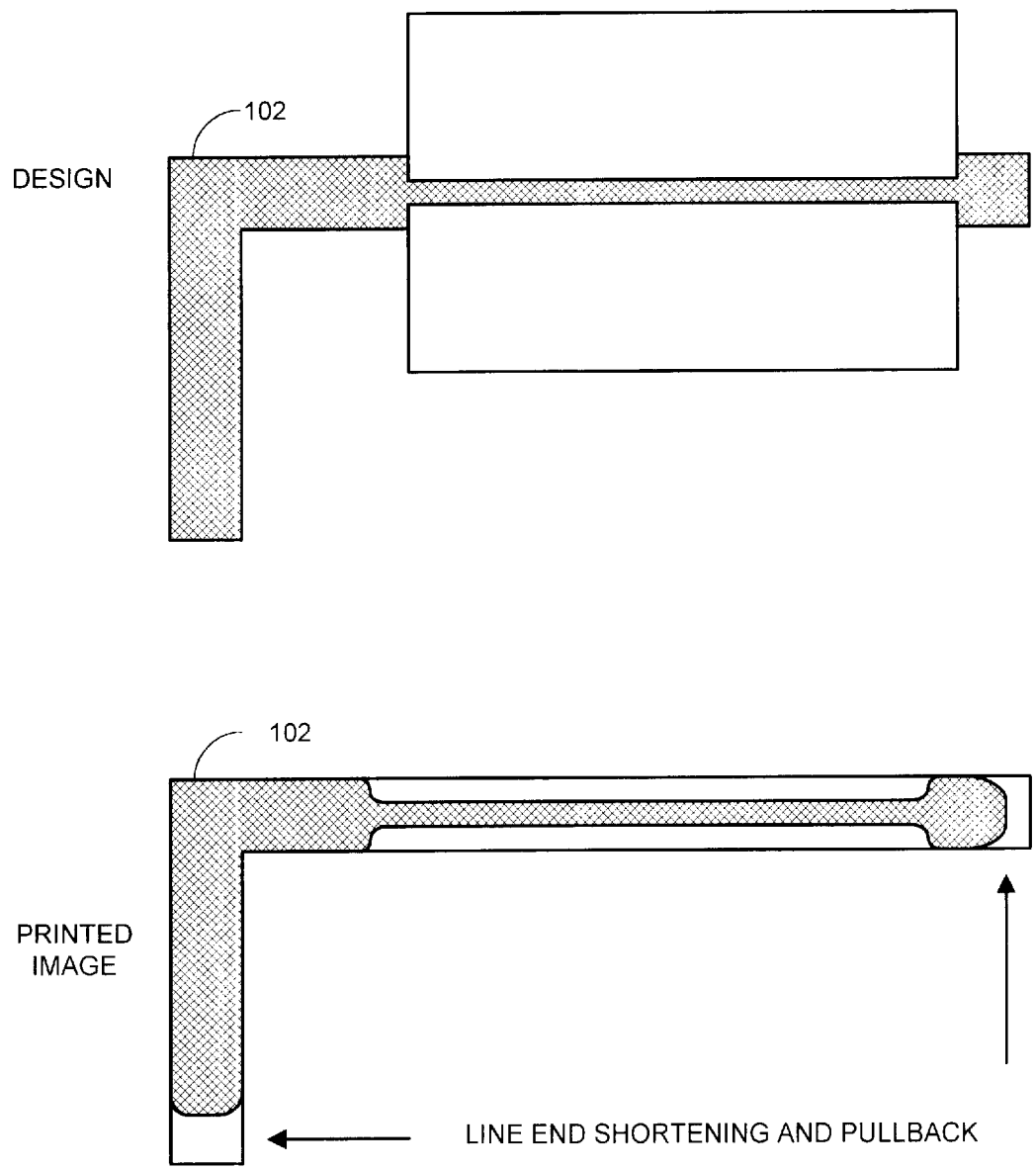
FIG. 1 illustrates the line end shortening problem.
Figure 2:
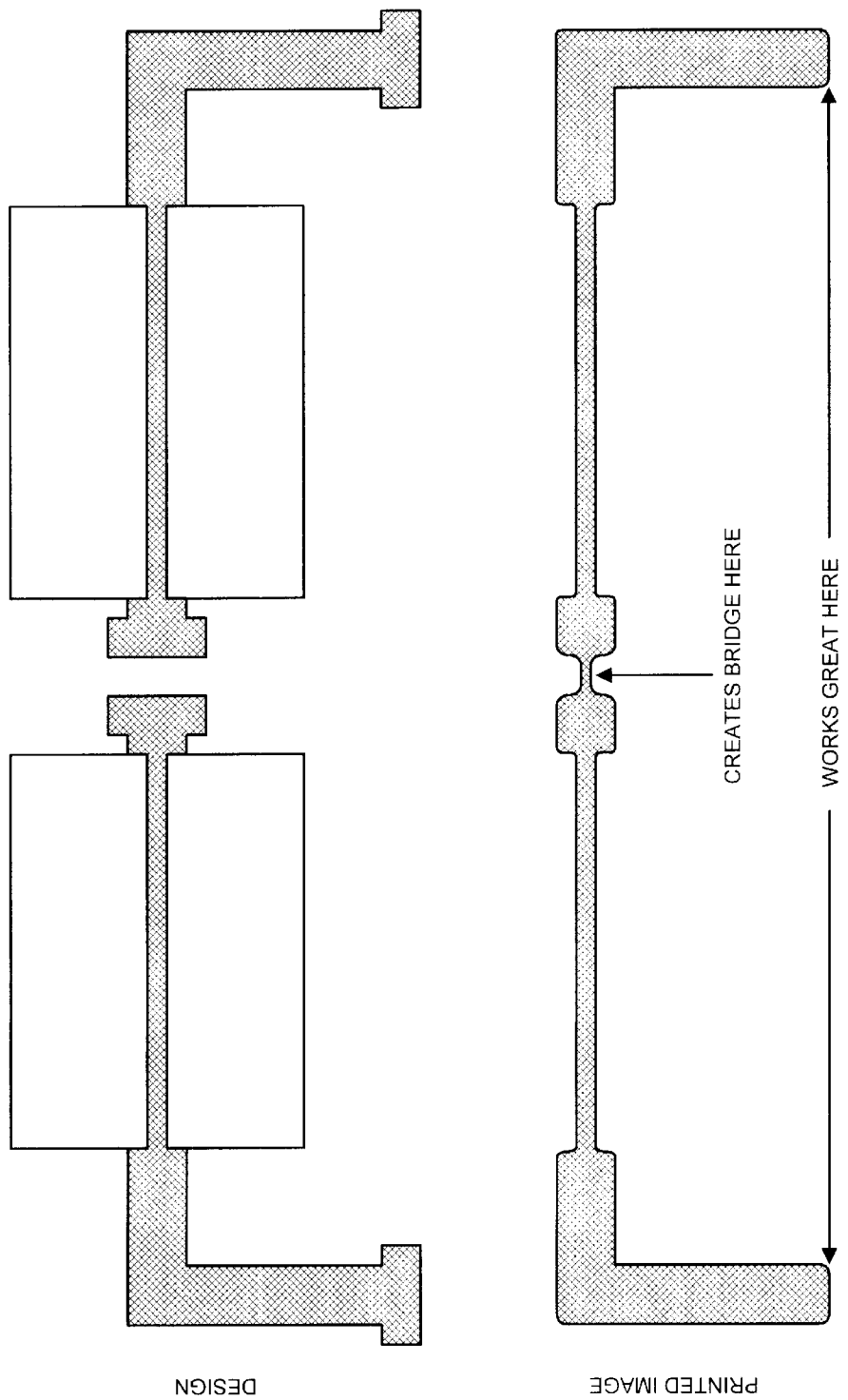
FIG. 2 illustrates the use of hammer heads to compensate for the line end shortening problem.
Figure 3A:
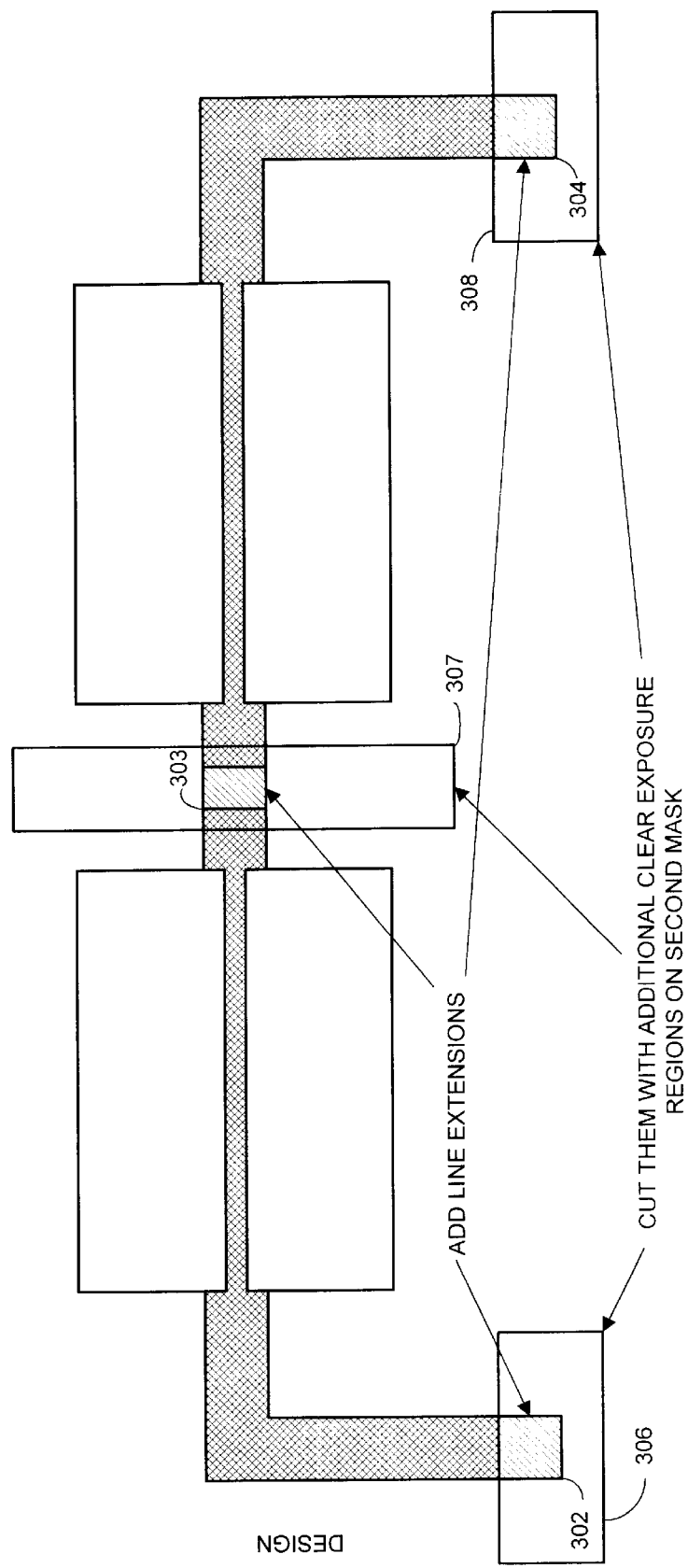
FIG. 3A illustrates the use of exposure regions to cut line ends in accordance with an embodiment of the invention.

FIG. 3A illustrates the use of exposure regions to cut line ends in accordance with an embodiment of the invention. Line end extensions 302–304 are first added to a first mask to create the polysilicon lines for two transistors illustrated in FIG. 3A. Next, clear exposure regions 306–308 are created within a second mask in order to cut through the extended polysilicon lines created by the first mask.

Figure 3B:
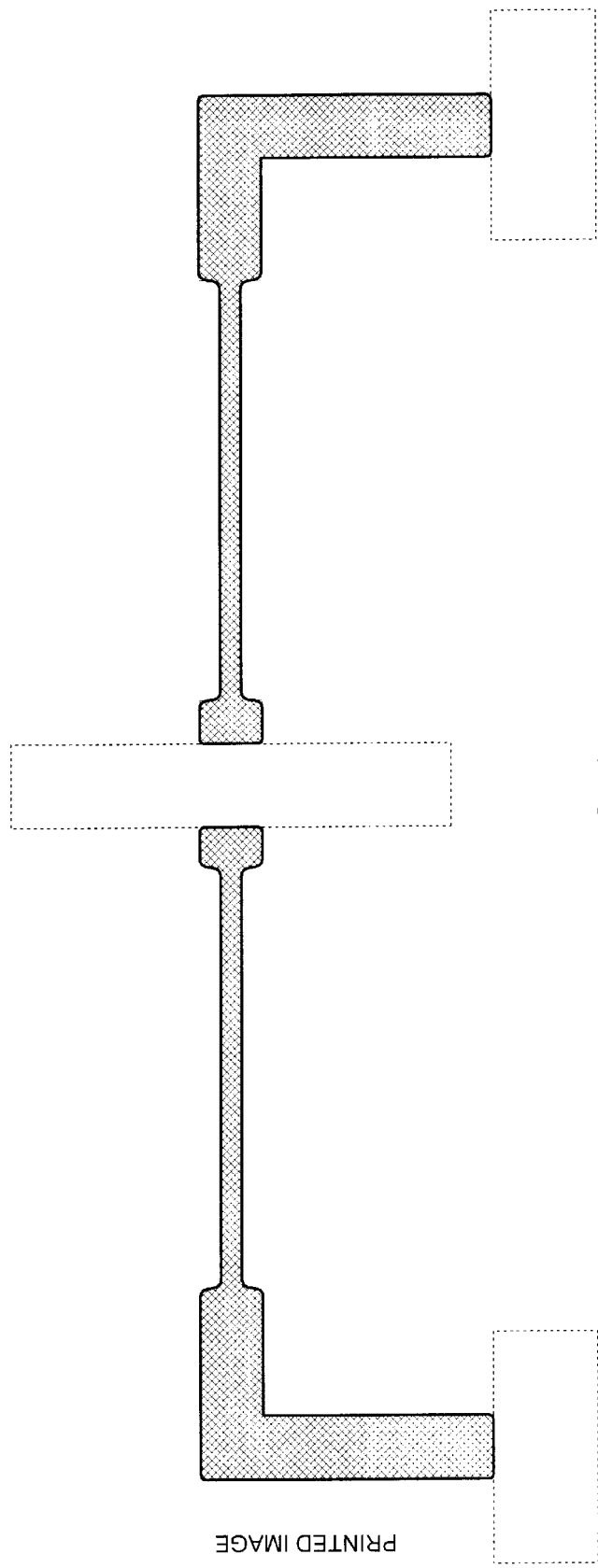
FIG. 3B illustrates the resulting line ends from using exposure regions in accordance with an embodiment of the invention.

FIG. 3B illustrates the resulting line ends from using exposure regions in accordance with an embodiment of the invention. By using the second mask to cut through the extended polysilicon lines, line ends are created without the optical line end shortening that arises from using a single mask to create line ends. This is because the second mask cuts the line end with an edge that crosses the extended polysilicon line. Since both the first mask and the second mask use edges to expose the photoresist layer, and not line ends, neither the exposure through the first mask nor the exposure through the second mask suffers from optical problems that result from exposing the photoresist layer through a line end feature on a mask.

Note that the invention is not limited to creating line ends in polysilicon lines. It can also used to create line ends in metal lines or any other type of signal line.

Also note that the photoresist layer can be exposed through the first mask prior to exposure through the second mask, or alternatively, the photo resist layer can be exposed through the second mask prior to exposure through the first mask.

Furthermore, note that by using exposure regions 306–308 to cut through the extended lines, a closer separation can be achieved between line ends. For example, the line ends created by exposure region 307 can be closer together than would be possible if hammer heads where used, because hammer heads may require additional separation between the line ends.

Wafer Fabrication Process

Figure 4:
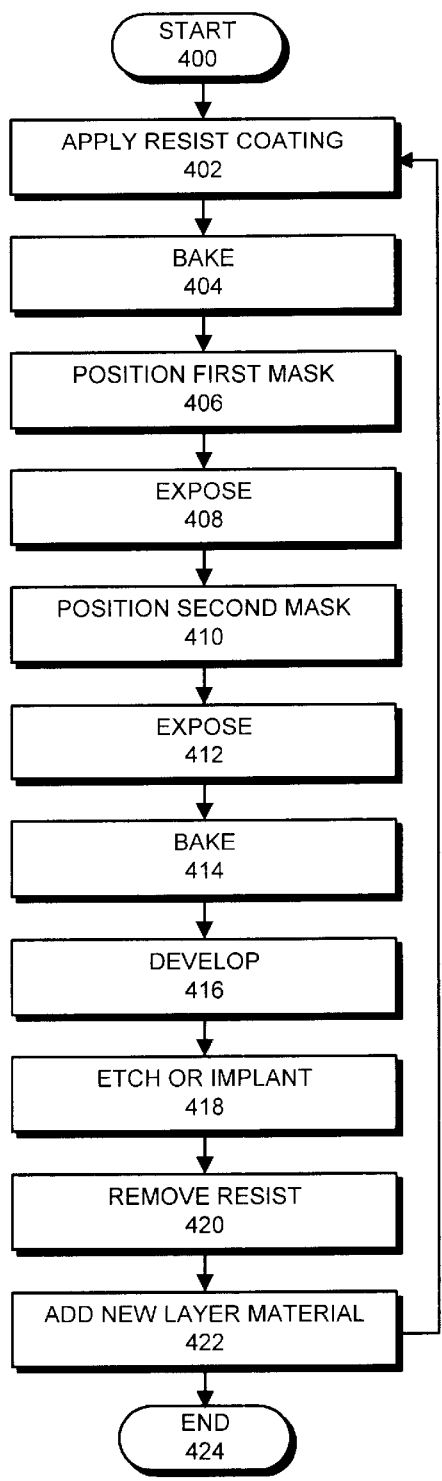
FIG. 4 is a flow chart illustrating the wafer fabrication process in accordance with an embodiment of the invention.

FIG. 4 is a flow chart illustrating the wafer fabrication process in accordance with an embodiment of the invention. The system starts by applying the resist coating to the top surface of a wafer (step 402). Next, the system bakes the resist layer (step 404). The system then positions the first mask over the photoresist layer (step 406), and then exposes the photoresist layer through the first mask (step 408). Next, the system positions the second mask over the photoresist layer (step 410), and then exposes the photoresist layer through the second mask (step 412). The system then bakes the wafer again (step 414) before developing the photoresist layer (step 416). Next, either a chemical etching or ion implantation step takes place (step 418) before the photoresist layer is removed (step 420). Finally, a new layer of material can be added and the process can be repeated for the new layer (step 422).

Creating Masks to Control Line End Shortening

Figure 5:
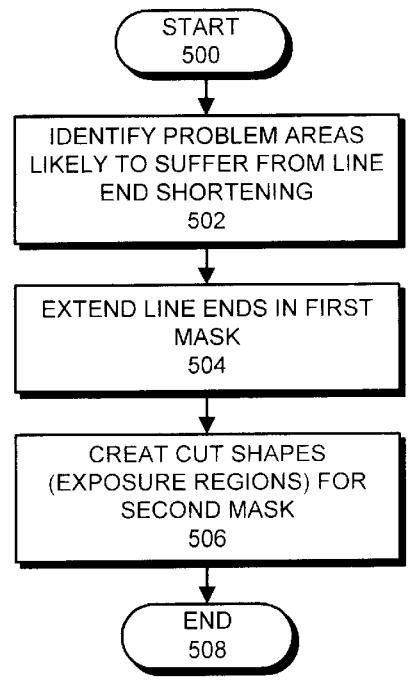
FIG. 5 is a flow chart illustrating the process of creating two masks to produce line ends in accordance with an embodiment of the invention.
Figure 6:
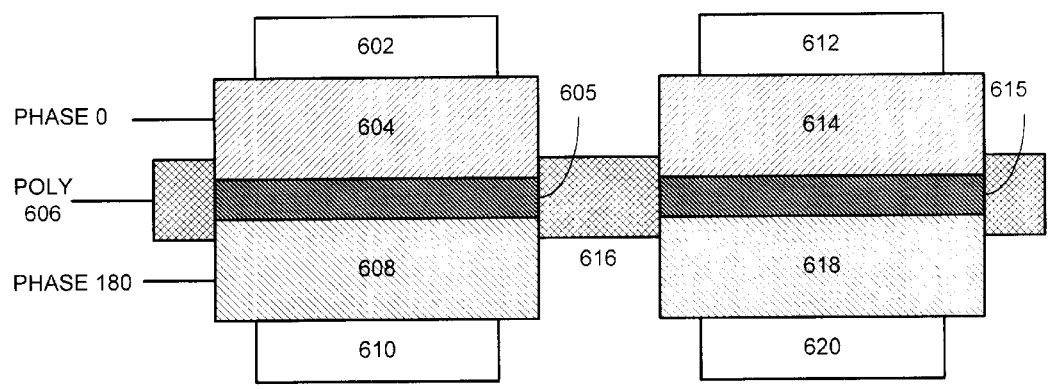
FIG. 6 illustrates two neighboring phase shifters with a potential area of incidental exposure between them.
Figure 7:
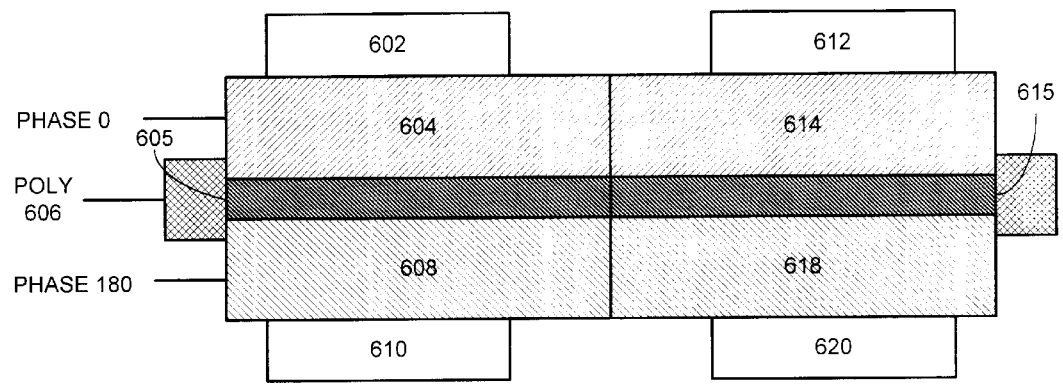
FIG. 7 illustrates the technique of extending phase shifters to protect a polysilicon line in a field region to avoid incidental exposure.

FIG. 5 is a flow chart illustrating the process of creating two masks to produce line ends in accordance with an embodiment of the invention. The system starts by identifying problem areas that are likely to by adversely affected by line end shortening problems (step 502). This can be accomplished by examining minimum spacing and minimum line widths in critical areas, such as contact overlays, via overlays, metal overlays, and endcap areas. Next, the system extends (or merges) existing line ends in creating a first mask (step 504). Note that a line end extension may be co-linear with the rest of the line, as is illustrated in FIG. 3. Alternatively, in another embodiment of the present invention, a line end extension may extend in other directions in order to merge with nearby features in the layout.

The system also creates cut shapes in the second mask to form exposure regions on the underlying photoresist layer (step 506). The first and second masks are then used in the wafer fabrication process outlined in FIG. 4 above.

Note that the above process can be carried out automatically under software control. Alternatively, the above process can be carried out manually by a human being.

Using a Phase Shifter with Widened Regulator

Figure 8:
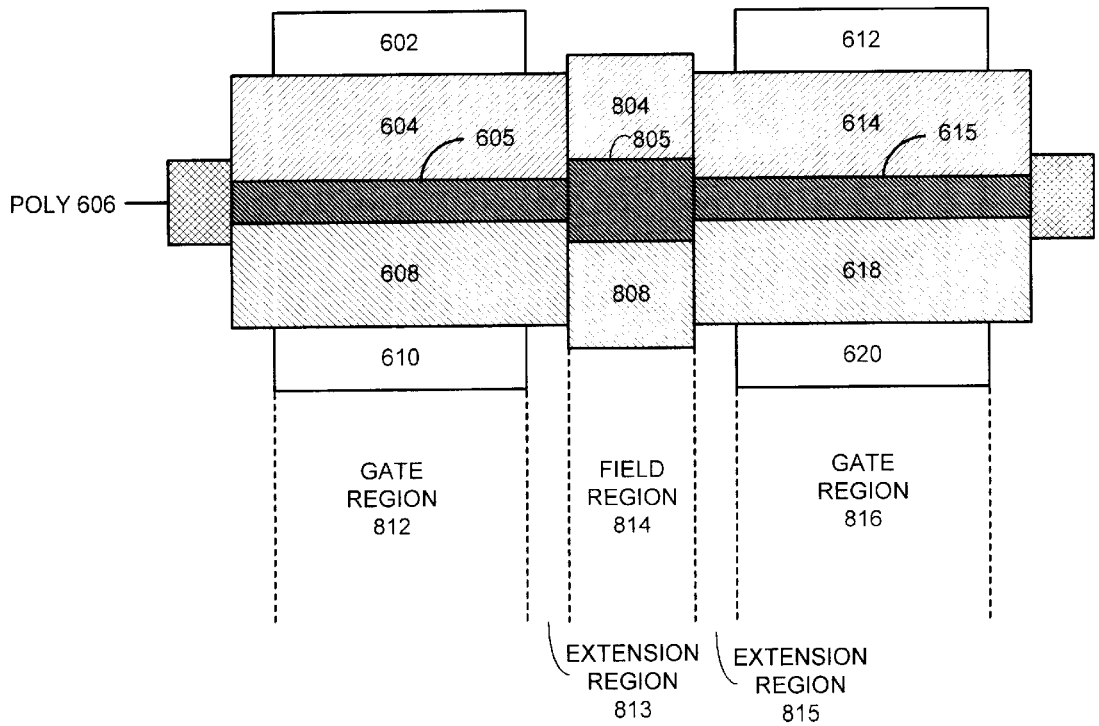
FIG. 8 illustrates the technique of using a phase shifter with a widened regulator to protect a polysilicon line in a field region in accordance with an embodiment of the invention.

FIG. 8 illustrates the technique of using an additional phase shifter with a widened regulator to protect a polysilicon line in a field region in accordance with an embodiment of the invention.

This additional phase shifter is placed over polysilicon line 606 as it passes through field region 814 between the first and second transistors. This additional phase shifter is composed of a zero-degree phase clear area 804, and a 180-degree phase clear area 808, that are separated by widened chromium regulator 805. This widened regulator 805 protects the underlying polysilicon line 606 from becoming significantly reduced in width by the additional phase shifter, while at the same time protecting polysilicon line 606 in field region 814 from incidental exposure.

Polysilicon line 606 passes through gate regions 812 and 816 within the first and second transistors, extension regions 813 and 815, and field region 814 between the first and second transistors. Note that the various embodiments can generally have different regulator widths in each of the three different types of regions.

Figure 9:
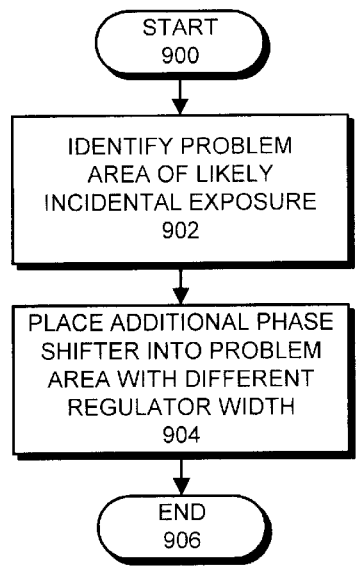
FIG. 9 is a flow chart illustrating the process of placing an additional phase shifter with a widened regulator over a polysilicon line in a field region in accordance with an embodiment of the invention.

FIG. 9 is a flow chart illustrating the process of placing an additional phase shifter with a widened regulator over a polysilicon line in a field region in accordance with an embodiment of the invention. The system starts by identifying a problem area of likely incidental exposure in the vicinity of a phase shifter on the phase shifting mask (step 902). The system then places an additional phase shifter with a wider chromium regulator into the problem area in order to protect an underlying polysilicon line 606 from incidental exposure, while at the same time protecting the polysilicon line 606 from becoming significantly reduced in width (step 904).

Note that the above process can be carried out automatically under software control. Alternatively, the above process can be carried out manually by a human being.

Also note that the above process can create a semiconductor chip with polysilicon lines in field regions in close proximity to features created through phase shifting without problems of incidental exposure, and without the line width reduction problems caused by extending phase shifters.

Extending Phase Shifters and Using Exposure Regions to Create Line Ends

Figure 10A:
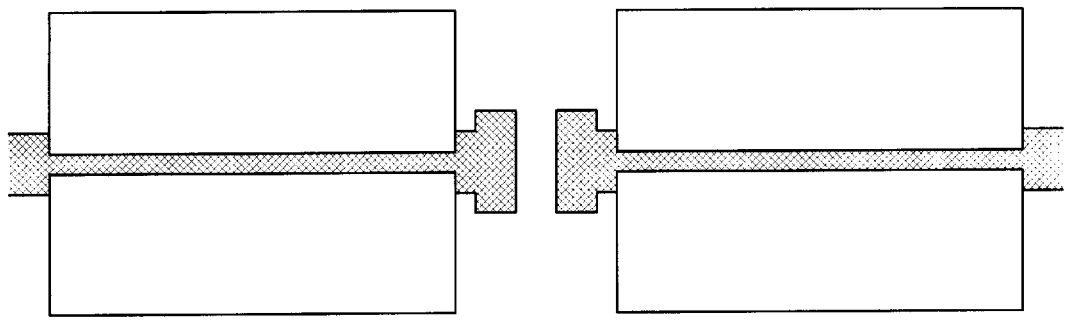
FIG. 10A illustrates the use of hammer heads to compensate for the line end shortening problem.

FIG. 10A illustrates the use of hammer heads to compensate for the line end shortening problem. As noted above, these hammer heads may create design rule violations that necessitate a wider separation between transistors. As was mentioned above with reference to FIG. 3, this problem can be remedied by adding a polysilicon line extension 303 and cutting the line extension 303 with an exposure region 307.

Figure 10B:
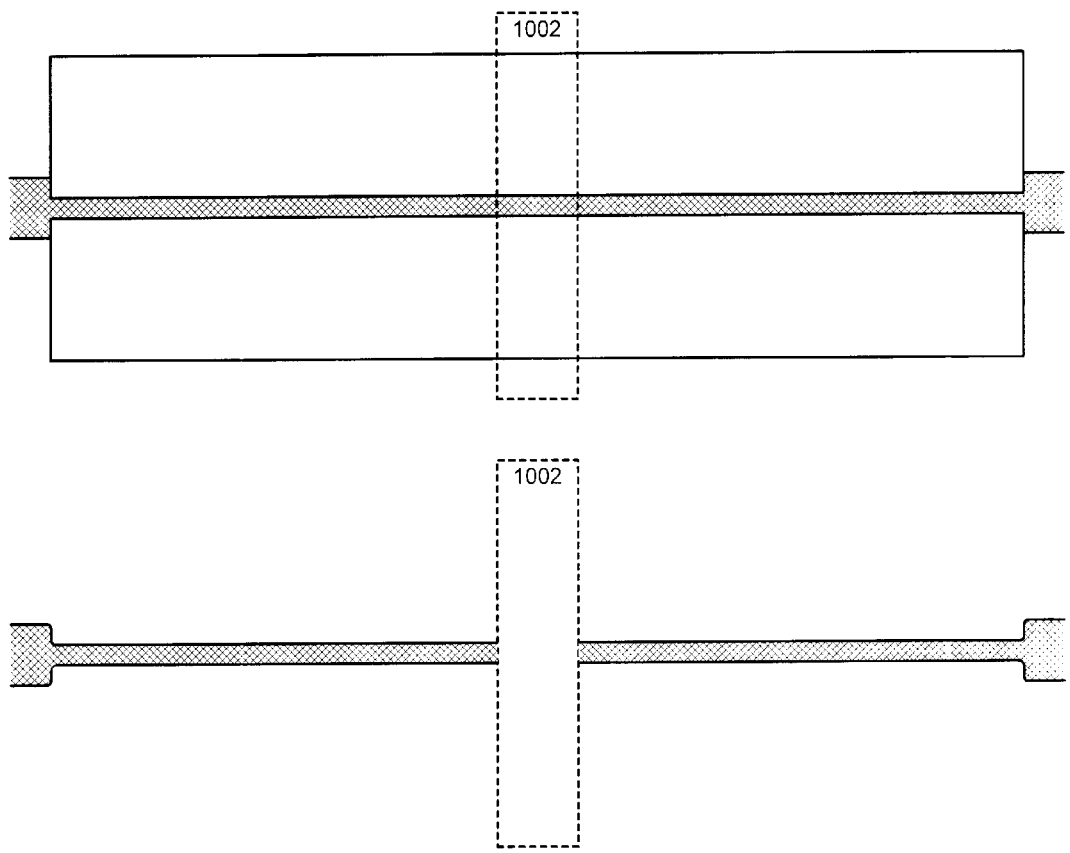
FIG. 10B illustrates the use of exposure regions and extended phase shifters to create line ends in accordance with an embodiment of the invention.

Another way to solve this problem is to extend the polysilicon lines and the phase shifters of the two transistors so that they form a single unified phase shifter that operates on a single unified polysilicon line, as is illustrated in the top portion of FIG. 10B. This single unified polysilicon line is then cut with an exposure region 1002 to form line ends as is illustrated in the bottom portion of FIG. 10B.

Note that the single unified phase shifter in FIG. 10 may have a different width (and possibly a different chromium regulator width) in the region between the line ends as is illustrated in FIG. 8.

The foregoing descriptions of embodiments of the invention have been presented for purposes of illustration and description only. They are not intended to be exhaustive or to limit the invention to the forms disclosed. Accordingly, many modifications and variations will be apparent to practitioners skilled in the art. Additionally, the above disclosure is not intended to limit the invention. The scope of the invention is defined by the appended claims.

What is claimed is:

1. A method for reducing incidental exposure caused by phase shifting during fabrication of a semiconductor chip, comprising:

identifying a problem area of likely incidental exposure in close proximity to an existing phase shifter on a phase shifting mask;

wherein the problem area includes a polysilicon line passing through a field region of the semiconductor chip;

wherein the incidental exposure is likely to degrade the polysilicon line passing through the field region; and placing an additional phase shifter into the problem area on the phase shifting mask so that a regulator within the additional phase shifter protects the polysilicon line passing through the field region;

wherein the additional phase shifter has a wider regulator than the existing phase shifter, wherein the existing phase shifter is used to expose a polysilicon line in a gate region of the semiconductor chip.

2. The method of claim 1, wherein the additional phase shifter is located so that it becomes an extension of the existing phase shifter, wherein the extension has a wider regulator than the existing phase shifter.

3. The method of claim 2, wherein the existing phase shifter extends past the gate region into an extension region prior to reaching the additional phase shifter located in the field region.

4. The method of claim 3, wherein the polysilicon line is protected by the regulator within the extended phase shifter, wherein the regulator has a first width in the gate region, a second width in the extension region and a third width in the field region.

5. The method of claim 1, wherein the additional phase shifter couples together a first existing phase shifter, that covers a gate region of a first transistor, with a second existing phase shifter, that covers a gate region of a second transistor, to form a combined phase shifter that covers the gate region of the first transistor, the gate region of the second transistor, and a field region between the first transistor and the second transistor, wherein the combined phase shifter has a regulator that is wider in the field region than in either of the gate regions.

6. The method of claim 1, further comprising using the phase shifting mask and a non-phase shifting binary mask in a double exposure process to fabricate a layer on the semiconductor chip.

7. The method of claim 6, wherein the phase shifting mask and the non-phase shifting binary mask comprise:

a first mask having opaque regions and transmissive regions that are organized into a first pattern that defines an unexposed line on a photoresist layer on a surface of a semiconductor wafer when positioned under the first mask; and a second mask having opaque regions and transmissive regions that are organized into a second pattern that defines an exposure region on the photoresist layer when positioned under the second mask;

wherein the exposure region cuts through the unexposed line defined by the first mask on the photoresist layer to create a line end in the unexposed line, without the optical line end shortening that arises from creating the line end with a single mask.

8. The method of claim 1, wherein the additional phase shifter includes a zero-degree phase clear area on one side of the polysilicon line, a regulator covering the polysilicon line, and a 180-degree phase clear area on the other side of the polysilicon line, whereby exposure energy shining through the phase shifting mask produces a region of destructive interference on a photoresist layer that is used to produce the polysilicon line.

9. The method of claim 1, wherein the regulator is formed using chromium.

10. A mask for use in fabricating a semiconductor chip, wherein the mask is configured to reduce incidental exposure caused phase shifting, comprising:

an existing phase shifter within the mask that is configured to create a region of destructive interference on a photoresist layer;

a problem area of likely incidental exposure in close proximity to the existing phase shifter within the mask;

wherein the problem area includes a polysilicon line passing through a field region of the semiconductor chip;

wherein the incidental exposure is likely to degrade the polysilicon line passing through the field region; and an additional phase shifter located in the problem area on the mask so that a regulator within the additional phase shifter protects the polysilicon line passing through the field region;

wherein the additional phase shifter has a wider regulator than the existing phase shifter, wherein the existing phase shifter is used to expose a polysilicon line in a gate region of the semiconductor chip.

11. The mask of claim 10, wherein the additional phase shifter is located so that it becomes an extension of the existing phase shifter, wherein the extension has a wider regulator than the existing phase shifter.

12. The mask of claim 11, wherein the existing phase shifter extends past the gate region into an extension region prior to reaching the additional phase shifter located in the field region.

13. The mask of claim 12, wherein the polysilicon line is protected by the regulator within the extended phase shifter, wherein the regulator has a first width in the gate region, a second width in the extension region and a third width in the field region.

14. The mask of claim 10, wherein the additional phase shifter couples together the existing phase shifter, that covers a gate region of a first transistor, with a second existing phase shifter, that covers a gate region of a second transistor, to form a combined phase shifter that covers the gate region of the first transistor, the gate region of the second transistor, and a field region between the first transistor and the second transistor, wherein the combined phase shifter has a regulator that is wider in the field region than in either of the gate regions.

15. The mask of claim 14, further comprising a non-phase shifting binary mask to be used in a double exposure process in conjunction with the mask to fabricate a layer on the semiconductor chip.

16. The mask of claim 15, wherein the mask and the non-phase shifting binary mask comprise:

a first mask having opaque regions and transmissive regions that are organized into a first pattern that defines an unexposed line on the photoresist layer on a surface of a semiconductor wafer when positioned under the first mask; and a second mask having opaque regions and transmissive regions that are organized into a second pattern that defines an exposure region on the photoresist layer when positioned under the second mask;

wherein the exposure region cuts through the unexposed line defined by the first mask on the photoresist layer to create a line end in the unexposed line, without the optical line end shortening that arises from creating the line end with a single mask.

17. The mask of claim 10, wherein the additional phase shifter includes a zero-degree phase clear area on one side of the polysilicon line, a regulator covering the polysilicon line, and a 180-degree phase clear area on the other side of the polysilicon line, whereby exposure energy shining through the mask produces the region of destructive interference on the photoresist layer that is used to produce the polysilicon line.

18. The mask of claim 10, wherein the regulator is formed using chromium.

19. A computer-readable storage medium storing instructions that when executed by a computer cause the computer to perform a method for reducing incidental exposure caused by phase shifting during fabrication of a semiconductor chip, the method comprising:

identifying an area of likely incidental exposure in close proximity to an existing phase shifter on a phase shifting mask;

wherein the area of likely incidental exposure includes a polysilicon line passing through a field region of the semiconductor chip;

wherein the incidental exposure is likely to degrade the polysilicon line passing through the field region;

placing an additional phase shifter into the area of likely incidental exposure on the phase shifting mask so that a regulator within the additional phase shifter protects the polysilicon line passing through the field region;

wherein the additional phase shifter has a wider regulator than the existing phase shifter, wherein the existing phase shifter is used to expose a polysilicon line in a gate region of the semiconductor chip.

20. The computer-readable storage medium of claim 19, wherein the additional phase shifter is located so that it becomes an extension of the existing phase shifter, wherein the extension has a wider regulator than the existing phase shifter.

21. The computer-readable storage medium of claim 19, wherein the additional phase shifter includes a zero-degree phase clear area on one side of the polysilicon line, a regulator covering the polysilicon line, and a 180-degree phase clear area on the other side of the polysilicon line, whereby exposure energy shining through the phase shifting mask produces a region of destructive interference on a photoresist layer that is used to produce the polysilicon line.

22. A system for reducing incidental exposure caused by phase shifting during fabrication of a semiconductor chip, comprising:

a first means including opaque regions and transmissive regions that are organized into a pattern for exposing a photoresist layer on a surface of a semiconductor wafer;

an existing phase shifting means within the first means for creating a region of destructive interference on the photoresist layer;

a problem area of likely incidental exposure in close proximity to the existing phase shifting means within the first means;

wherein the problem area includes a polysilicon line passing through a field region of the semiconductor chip;

wherein the incidental exposure is likely to degrade the polysilicon line passing through the field region; and an additional phase shifting means located in the problem area on the first means, so that a regulator within the additional phase shifting means protects the polysilicon line passing through the field region;

wherein the additional phase shifting means has a wider regulator than the existing phase shifting means, wherein the existing phase shifting means is used to expose a polysilicon line in a gate region of the semiconductor chip.

23. An integrated circuit fabricated using a process that reduces incidental exposure caused by phase shifting, wherein the process comprises:

identifying a problem area of likely incidental exposure in close proximity to an existing phase shifter on a phase shifting mask;

wherein the problem area includes a polysilicon line passing through a field region of a semiconductor chip;

wherein the incidental exposure is likely to degrade the polysilicon line passing through the field region; and placing an additional phase shifter into the problem area on the phase shifting mask so that a regulator within the additional phase shifter protects the polysilicon line passing through the field region;

wherein the additional phase shifter has a wider regulator than the existing phase shifter, wherein the existing phase shifter is used to expose a polysilicon line in a gate region of the semiconductor chip.

* * * * *